(12) United States Patent
Stulik

(10) Patent No.: US 11,038,519 B2
(45) Date of Patent: Jun. 15, 2021

(54) CIRCUITS AND METHODS FOR REDUCING CHARGE LOSSES IN SWITCHED CAPACITOR ANALOG TO DIGITAL CONVERTERS

(71) Applicant: Texas Instruments Incorporated, Dallas, TX (US)

(72) Inventor: Paul Stulik, Tucson, AZ (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/891,011

(22) Filed: Jun. 2, 2020

(65) Prior Publication Data

US 2021/0126645 A1    Apr. 29, 2021

Related U.S. Application Data

(60) Provisional application No. 62/927,144, filed on Oct. 29, 2019.

(51) Int. Cl.
*H03M 1/12* (2006.01)
*H03M 1/46* (2006.01)
*H03M 1/80* (2006.01)

(52) U.S. Cl.
CPC ......... *H03M 1/466* (2013.01); *H03M 1/1245* (2013.01); *H03M 1/804* (2013.01)

(58) Field of Classification Search
CPC .... H03M 1/466; H03M 1/1245; H03M 1/804; H03M 1/802; H03M 1/806
USPC ........................................ 341/172, 155, 144
See application file for complete search history.

(56) References Cited

U.S. PATENT DOCUMENTS

| | | | | |
|---|---|---|---|---|
| 6,225,795 B1* | 5/2001 | Stratakos | ............... | H02M 3/156 323/283 |
| 6,867,723 B1* | 3/2005 | Tachibana | ............. | H03M 1/002 341/155 |
| 7,479,811 B2* | 1/2009 | Chou | ..................... | G11C 5/145 327/94 |
| 7,692,471 B2* | 4/2010 | Uno | ..................... | H03F 3/45192 327/337 |
| 8,570,205 B2* | 10/2013 | Sarraj | ..................... | H03F 3/005 341/161 |
| 8,610,465 B2* | 12/2013 | Jansson | ............... | H03F 3/45753 327/63 |

(Continued)

FOREIGN PATENT DOCUMENTS

| | | |
|---|---|---|
| JP | 2015/097333 | 5/2015 |
| KR | 2007-0067233 | 6/2007 |

OTHER PUBLICATIONS

International Search Report in corresponding PCT Application No. PCT/US2020/057299, dated Feb. 18, 2021 (2 pages).

*Primary Examiner* — Jean B Jeanglaude
(74) *Attorney, Agent, or Firm* — John R. Pessetto; Charles A. Brill; Frank D. Cimino

(57) ABSTRACT

Circuits and methods for minimizing charge losses due to negative transient voltage at summing terminals of an analog to digital converter (ADC) are disclosed. The ADC is coupled to a multi-bit digital to analog converter (DAC) at the summing terminals. The ADC and the DAC include PMOS and NMOS transistors whose timing are controlled to reduce charge losses. The PMOS transistors are turned ON before the NMOS transistors. Also, the PMOS transistor of the ADC is turned ON at a slower rate than the PMOS transistors of the DAC.

38 Claims, 3 Drawing Sheets

(56) References Cited

U.S. PATENT DOCUMENTS

| | | | |
|---|---|---|---|
| 8,810,283 B2* | 8/2014 | Hensley | H03K 17/687 |
| | | | 327/93 |
| 9,608,652 B2* | 3/2017 | Lee | H03M 1/123 |
| 2007/0024479 A1* | 2/2007 | Lin | H03K 3/35613 |
| | | | 341/144 |
| 2007/0030192 A1 | 2/2007 | Son | |
| 2009/0185406 A1* | 7/2009 | Uno | H03F 3/4565 |
| | | | 363/131 |
| 2010/0102870 A1* | 4/2010 | Seedher | H03F 3/45183 |
| | | | 327/427 |
| 2011/0204978 A1* | 8/2011 | Jansson | H03F 3/45753 |
| | | | 330/253 |
| 2013/0194122 A1* | 8/2013 | Sarraj | H03F 3/005 |
| | | | 341/172 |
| 2013/0314128 A1* | 11/2013 | Hensley | H03K 17/687 |
| | | | 327/93 |

\* cited by examiner

CIRCUITS AND METHODS FOR REDUCING CHARGE LOSSES IN SWITCHED CAPACITOR ANALOG TO DIGITAL CONVERTERS

CROSS REFERENCE TO RELATED APPLICATIONS

This application claims priority from U.S. Provisional Application No. 62/927,144, filed Oct. 29, 2019, entitled "CIRCUIT AND METHOD FOR ELIMINATING CHARGE-LOSS IN SWITCH CAPACITOR APPLICATIONS", assigned to the present assignee and incorporated herein by reference.

BACKGROUND

The disclosure generally relates to switched capacitor circuits, and particularly to circuits and methods for reducing charge losses due to negative transient voltage in switched capacitor analog to digital converters (ADCs).

DESCRIPTION OF THE RELATED ART

In a switched capacitor analog to digital converter (ADC), during a sampling phase a first set of switches is closed to couple sampling capacitors to an analog input voltage in order to charge the sampling capacitors. During a transfer phase, the first set of switches is opened to de-couple the sampling capacitors from the analog input voltage and a second set of switches is closed to transfer the charge from the sampling capacitors to an integrator circuit.

In a delta sigma ADC, a first stage integrator may be coupled to a single-bit or a multi-bit digital to analog converter (DAC) at summing terminals or nodes. The DAC converts a digital signal to an analog signal. The DAC may comprise DAC capacitors which are coupled to the summing terminals or nodes during the transfer phase, thus connecting the ADC's sampling capacitors to the DAC capacitors. During the transfer phase the charge from the sampling capacitors is combined with charge from the DAC capacitors at the summing terminals or nodes. The charge from the sampling capacitors generally cancels the charge from the DAC capacitors, resulting in a small residual charge transferred from the summing terminals or nodes to the integrator circuit.

For high speed, low power and high signal-to-noise ratio (SNR) performance, it is desirable to operate a delta sigma ADC core at a low supply voltage while sampling the analog input voltage at a significantly higher voltage. A low ADC core supply voltage makes it necessary to operate the ADC's first stage integrator circuit at a low input common-mode voltage when using power-efficient amplifiers with NMOS inputs.

When the charges from the ADC's sampling capacitors and the DAC capacitors start to combine during the transfer phase, the voltage level at the summing terminals deviates from a nominal input common mode voltage. When a large analog input voltage is applied, a large amount of charge combines, resulting in a large negative transient voltage at the summing terminals. Since the nominal input common-mode voltage at the summing terminals is already near ground, a large negative transient voltage results in an undershoot below ground, causing charge losses from the sampling capacitors and DAC capacitors. Even a small amount of charge losses can result in gain error, gain error drift and also cause non-linearity performance degradations.

SUMMARY

Various aspects of the present disclosure are directed to circuits and methods for reducing charge losses due to negative transient voltage in switched capacitor analog to digital converters (ADCs). In one aspect, the circuit includes an ADC having a first capacitor coupled between a first sampling terminal and a first summing terminal and a second capacitor coupled between a second sampling terminal and a second summing terminal. The ADC includes first NMOS and PMOS transistors coupled in parallel. The first and second PMOS transistors are configured to electrically disconnect the first and second sampling terminals during a sampling phase and to electrically connect the first and second sampling terminals during a transfer phase. The circuit also includes a digital to analog converter (DAC) having a third capacitor coupled between the first summing terminal and a first DAC terminal and a fourth capacitor coupled between the second summing terminal and a second DAC terminal. The DAC includes second NMOS and PMOS transistors coupled in parallel. The second NMOS and PMOS transistors are configured to electrically connect a first DAC output and the first DAC terminal during the transfer phase and to electrically disconnect the first DAC output and the first DAC terminal during the sampling phase. The DAC also includes third NMOS and PMOS transistors coupled in parallel. The third NMOS and PMOS transistors are configured to electrically connect a second DAC output and the second DAC terminal during the transfer phase and to electrically disconnect the second DAC output and the second DAC terminal during the sampling phase.

In an additional aspect of the present disclosure, gate signals are applied to gate terminals of the first, second and third PMOS transistors. The gate signal applied to the first PMOS transistor has a slower falling edge than the gate signal applied to the second and third PMOS transistors. Also, gate signals are applied to gate terminals of the first, second and third NMOS transistors after the second and third PMOS transistors are turned ON completely but before the first PMOS transistor is turned ON completely. The first PMOS transistor is turned ON at a slower rate than the second and third PMOS transistors, and the first, second and third NMOS transistors are turned ON after the first, second and third PMOS transistors are turned ON.

In an additional aspect of the disclosure, the gate signals are removed from the gate terminals of the first PMOS and NMOS transistors during the sampling phase to electrically disconnect the first and second sampling terminals, and the gate signals are removed from the gate terminals of the second PMOS and NMOS transistors during the sampling phase to electrically disconnect the first DAC output and the first DAC terminal. The gate signals are removed from the gate terminals of the third PMOS and NMOS transistors during the sampling phase to electrically disconnect the second DAC output and the second DAC terminal.

In an additional aspect of the disclosure, the ADC includes a fourth switch configured to electrically connect the first and second summing terminals during the sampling phase and to electrically disconnect the first and second summing terminals during the transfer phase. The DAC includes a fifth switch configured to electrically connect the first and second DAC terminals during the sampling phase and to electrically disconnect the first and second DAC terminals during the transfer phase.

In an additional aspect of the disclosure, the ADC includes a differential integrator having first and second inputs which are coupled to the respective first and second summing terminals during the transfer phase to integrate residual charges at the first and second summing terminals.

In an additional aspect of the disclosure, a circuit includes an ADC having a first capacitor coupled between a first sampling terminal and a first summing terminal and a second capacitor coupled between a second sampling terminal and a second summing terminal. The ADC includes first NMOS and PMOS transistors having respective source, drain and gate terminals. The drain terminal of the first NMOS transistor is coupled to the source terminal of the first PMOS transistor and the source terminal of the first NMOS transistor is coupled to the drain terminal of the first PMOS transistor. The first NMOS and the first PMOS transistor are operable to electrically disconnect the first and second sampling terminals during a sampling phase and to electrically connect the first and second sampling terminals during a transfer phase. The circuit also includes a DAC having a third capacitor coupled between the first summing terminal and a first DAC terminal and a fourth capacitor coupled between the second summing terminal and a second DAC terminal. The DAC includes second NMOS and PMOS transistors having respective drain, source and gate terminals. The drain terminal of the second NMOS transistor is coupled to the source terminal of the second PMOS transistor and the source terminal of the second NMOS transistor is coupled to the drain terminal of the second PMOS transistor. The second NMOS and PMOS transistors are operable to electrically connect a first DAC output and the first DAC terminal during the transfer phase and to electrically disconnect the first DAC output and the first DAC terminal during the sampling phase. The DAC also includes third NMOS and PMOS transistors having respective drain, source and gate terminals. The drain terminal of the third NMOS transistor is coupled to the source terminal of the third PMOS transistor and the source terminal of the third NMOS transistor is coupled to the drain terminal of the third PMOS transistor. The third NMOS and PMOS transistors are operable to electrically connect a second DAC output and the second DAC terminal during the transfer phase and to electrically disconnect the second DAC output and the second DAC terminal during the sampling phase. In an additional aspect of the disclosure, gate signals are applied to gate terminals of the first, second and third PMOS transistors. The gate signal applied to the first PMOS transistor has a slower falling edge than the gate signal applied to the second and third PMOS transistors. In an additional aspect of the disclosure, gate signals are applied to gate terminals of the first, second and third NMOS transistors after the second and third PMOS transistors are turned ON completely but before the first PMOS transistor is turned ON completely. The first PMOS transistor is turned ON at a slower rate than the second and third PMOS transistors. The first, second and third NMOS transistors are turned ON after the first, second and third PMOS transistors are turned ON.

In an additional aspect of the disclosure, a circuit includes an ADC having first and second summing terminals. The ADC includes a first capacitor coupled between a first sampling terminal and the first summing terminal and a second capacitor coupled between a second sampling terminal and the second summing terminal. The ADC also includes first NMOS and PMOS transistors coupled in parallel between the first and second sampling terminals and configured to electrically disconnect the first and second sampling terminals during a sampling phase and to electrically connect the first and second sampling terminals during a transfer phase. The circuit includes a DAC having a third capacitor coupled between the first summing terminal and a first DAC terminal and a fourth capacitor coupled between the second summing terminal and a second DAC terminal. The DAC includes second NMOS and PMOS transistors coupled in parallel and configured to electrically connect a first DAC output and the first DAC terminal during the transfer phase and to electrically disconnect the first DAC output and the first DAC terminal during the sampling phase. The DAC includes third NMOS and PMOS transistors coupled in parallel and configured to electrically connect a second DAC output and the second DAC terminal during the transfer phase and to electrically disconnect the second DAC output and the second DAC terminal during the sampling phase. In an additional aspect of the disclosure, gate signals are applied to gate terminals of the first, second and third PMOS transistors. The gate signal applied to the first PMOS transistor has a slower falling edge than the gate signal applied to the second and third PMOS transistors to turn ON the first PMOS transistor at a slower rate than the second and third PMOS transistors. Also, gate signals are applied to gate terminals of the first, second and third NMOS transistors after the second and third PMOS transistors are turned ON completely but before the first PMOS transistor is turned ON completely to minimize the negative voltage transients at the first and second summing nodes during the transfer phase.

In an additional aspect of the disclosure, a method reduces charge loss at summing terminals which connect an analog to digital converter (ADC) to a digital to analog converter (DAC) by controlling the timing of PMOS and NMOS transistors of the ADC and the DAC. The method includes applying respective gate signals to gate terminals of a first PMOS transistor of the ADC and second and third PMOS transistors of the DAC. The gate signal applied to the first PMOS transistor has a slower falling edge than the gate signals applied to the second and third PMOS transistors. As a result, the first PMOS transistor of the ADC is turned ON at a slower rate than the second and third PMOS transistors of the DAC. After the second and third PMOS transistors of the DAC are completely turned ON but before the first PMOS transistor is completely turned ON, the method includes applying a gate signal having a rising edge to gate terminals of a first NMOS transistor of the ADC and second and third NMOS transistors of the DAC. As a result, the first NMOS transistor of the ADC and the second and third NMOS transistors of the DAC are turned ON at approximately the same rate.

DETAILED DESCRIPTION

Reference will now be made in detail to the embodiments, examples of which are illustrated in the accompanying drawings, in which some, but not all embodiments are shown. Indeed, the concepts may be embodied in many different forms and should not be construed as limiting herein. Rather, these descriptions are provided so that this disclosure will satisfy applicable requirements.

Figure 1:
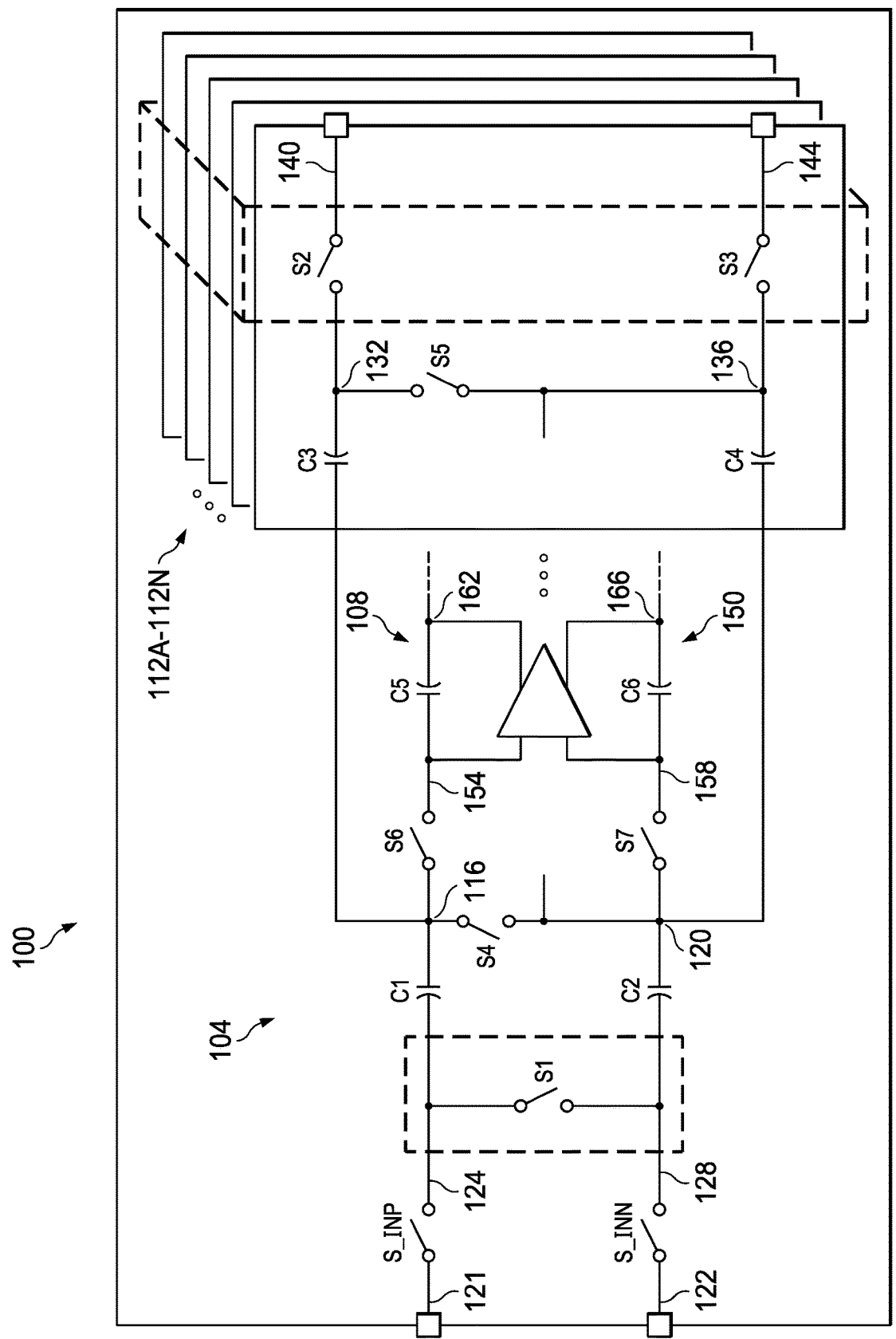
FIG. 1 is a circuit in accordance with an exemplary embodiment.

FIG. 1 is a circuit 100 in accordance with an exemplary embodiment of the present disclosure. The circuit 100 includes an analog to digital converter (ADC) 104 whose first stage integrator 108 is coupled to a single-bit or a multi-bit DAC 112A-112N at first and second summing terminals or nodes 116 and 120. The term "terminal" and the term "node" are used interchangeably herein. The circuit 100 reduces charge losses at the summing terminals or nodes 116 and 120 during a transfer phase by controlling operation of PMOS and NMOS transistors of the ADC 104 and the DAC 112A-112N.

With reference to FIG. 1, the ADC 104 includes differential input terminals 121 and 122 which can be coupled to receive an analog input voltage. The differential input terminal 121 is coupled to a first sampling terminal or node 124 via an input switch S_INP, and the differential input terminal 122 is coupled to a second sampling terminal or node 128 via an input switch S_INN. The ADC 104 also includes a first capacitor C1 coupled between the first sampling terminal or node 124 and the first summing terminal or node 116. The ADC 104 also includes a second capacitor C2 coupled between the second sampling terminal or node 128 and the second summing terminal or node 120. The ADC 104 also includes a first switch S1 coupled between the first and second sampling terminals or nodes 124 and 128. The first switch S1 is configured to electrically disconnect the first and second sampling terminals or nodes 124 and 128 during a sampling phase and to electrically connect the first and second sampling terminals or nodes 124 and 128 during a transfer phase.

With continuing reference to FIG. 1, the DAC 112A includes a third capacitor C3 coupled between the first summing terminal 116 and a first DAC terminal 132 and also includes a fourth capacitor C4 coupled between the second summing terminal 120 and a second DAC terminal 136. The DAC 112A also includes a second switch S2 configured to electrically connect a first DAC output 140 and the first DAC terminal 132 during the transfer phase and to electrically disconnect the first DAC output 140 and the first DAC terminal 132 during the sampling phase. The DAC 112A also includes a third switch S3 configured to electrically connect a second DAC output 144 and the second DAC terminal 136 during the transfer phase and to electrically disconnect the second DAC output 144 and the second DAC terminal 136 during the sampling phase.

With continuing reference to FIG. 1, the ADC 104 includes a fourth switch S4 configured to electrically connect the first and second summing terminals 116 and 120 during the sampling phase and to electrically disconnect the first and second summing terminals 116 and 120 during the transfer phase. The DAC 112A includes a fifth switch S5 configured to electrically connect the first and second DAC terminals 132 and 136 during the sampling phase and to electrically disconnect the first and second DAC terminals 132 and 136 during the transfer phase.

With continuing reference to FIG. 1, the ADC 104 includes a differential integrator 150 having a first input 154 coupled to the first summing terminal 116 via a switch S6 during the transfer phase and also includes a second input 158 coupled to the second summing terminal 120 via a switch S7 during the transfer phase. The differential integrator 150 includes an integrating capacitor C5 coupled between its first input 154 and its first output 162 and also includes an integrating capacitor C6 coupled between its second input 158 and its second output 166.

In operation, during the sampling phase the switches S1, S2, S3, S6 and S7 are opened but the switches S_INP, S_INN, S4 and S5 are closed, thereby providing a conduction path for the capacitors C1 and C2 to be charged by an analog input voltage Vin. During the transfer phase, the switches S1, S2, S3, S6 and S7 are closed but the switches S_INP, SINN, S4 and S5 are opened, thereby providing conduction paths for the charges from the capacitors C1, C2, C3 and C4 to be combined at the summing terminals 116 and 120. Most of the charges from the capacitors C1, C2, C3 and C4 cancel each other at the summing terminals 116 and 120, resulting in a residual charge being integrated by the differential integrator 150.

Figure 2A:
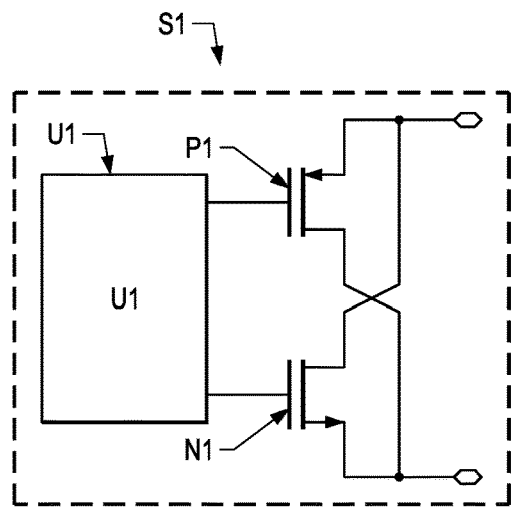
FIGS. 2A-2C illustrate switches in accordance with an exemplary embodiment.

FIG. 2A illustrates the switch S1 in more detail. In an exemplary embodiment of the present disclosure, the switch S1 includes first NMOS and PMOS transistors N1 and P1 which are coupled together in parallel, and the parallel-coupled transistors N1 and P1 are connected between the first and second sampling nodes 124 and 128. The first NMOS and PMOS transistors N1 and P1 include respective source, drain and gate terminals. The drain terminal of the first NMOS transistor N1 is coupled to the source terminal of the first PMOS transistor P1 and the source terminal of the first NMOS transistor N1 is coupled to the drain terminal of the first PMOS transistor P1. The first NMOS and PMOS transistors N1 and P1 are operable to electrically disconnect the first and second sampling terminals 124 and 128 during the sampling phase and to electrically connect the first and second sampling terminals 124 and 128 during the transfer phase.

With continuing reference to FIG. 2A, a driver circuit U1 is configured to control the operation of the first NMOS and PMOS transistors N1 and N2. During the transfer phase, the driver circuit U1 applies gate signals to the gate terminals of the first NMOS and PMOS transistors N1 and P1 to turn ON the first NMOS and PMOS transistors N1 and P1 and during the sampling phase removes the gate signals from the gate terminals of the first NMOS and PMOS transistors N1 and P1 to turn OFF the first NMOS and PMOS transistors N1 and P1.

Figure 2B:
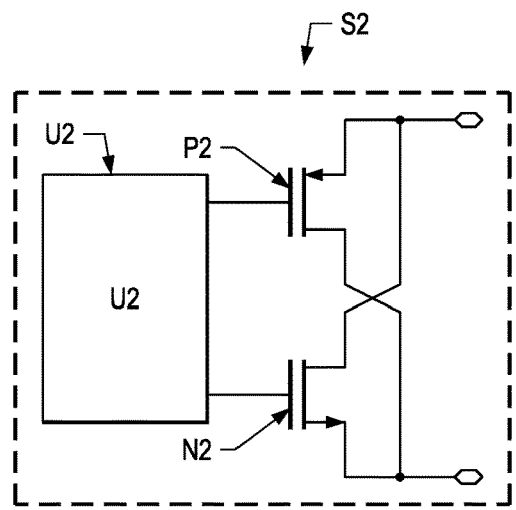
Figure 2C:
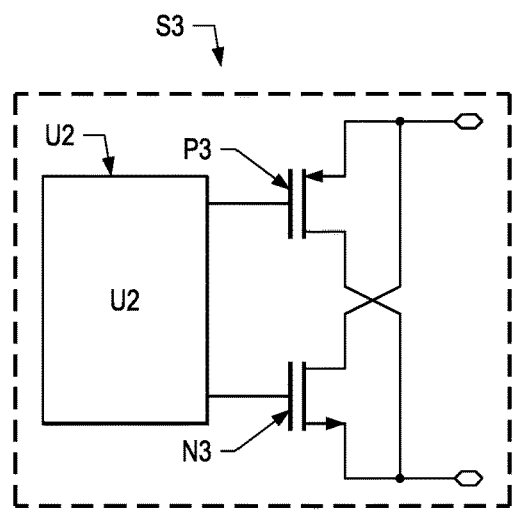

FIG. 2B illustrates the switch S2 in more detail. In an exemplary embodiment of the present disclosure, the switch S2 includes second NMOS and PMOS transistors N2 and P2 which are coupled together in parallel, and the parallel-coupled transistors N2 and P2 are connected between the first DAC terminal 132 and the first DAC output 140. The second NMOS and PMOS transistors N2 and P2 include respective source, drain and gate terminals. The drain terminal of the second NMOS transistor N2 is coupled to the source terminal of the second PMOS transistor P2 and the source terminal of the second NMOS transistor N2 is coupled to the drain terminal of the second PMOS transistor P2. The second NMOS and PMOS transistors N2 and P2 are operable to electrically disconnect the first DAC output 140 and the first DAC terminal 132 during the sampling phase and to electrically connect the first DAC output 140 and the first DAC terminal 132 during the transfer phase. FIG. 2C illustrates the switch S3 in more detail. The switch S3 includes third NMOS and PMOS transistors N3 and P3 which are coupled in parallel, and the parallel-coupled transistors N3 and P3 are connected between the second DAC terminal 136 and the second output 144. The configuration and operation of the switch S3 are similar to the configuration and operation of the switch S2.

With continuing reference to FIGS. 2B and 2C, a driver circuit U2 is configured to control operation of the second NMOS and PMOS transistors N2 and P2 and also the third NMOS and PMOS transistors N3 and P3. During the transfer phase, the driver circuit U2 applies gate signals to the gate terminals of the second NMOS and PMOS transistors N2 and P2 to turn ON the second NMOS and PMOS transistors N2 and P2 and during the sampling phase removes the gate signals from the gate terminals of the second NMOS and PMOS transistors N2 and P2 to turn OFF the second NMOS and PMOS transistors N2 and P2. The driver circuit U2 also applies gate signals to the gate terminals of the third NMOS and PMOS transistors N3 and P3 during the transfer phase to turn ON the third NMOS and PMOS transistors N3 and P3 and removes the gate signals from the gate terminals of the third NMOS and PMOS transistors N3 and P3 during the sampling phase to turn OFF the third NMOS and PMOS transistors N3 and P3.

In an exemplary embodiment of the present disclosure, during the transfer phase charge losses are reduced by preventing negative transient voltage at the summing terminals 116 and 120 by controlling and sequencing the timing of the PMOS and NMOS transistors of the switches S1, S2 and S3. More specifically, the gate signal applied to the gate terminal of the first PMOS transistor P1 has a slower falling edge than the falling edge of the gate signal applied to the gate terminals of both the second and third PMOS transistors P2 and P3. Since the gate signal applied to the gate terminal of the first PMOS transistor P1 has a lower negative slope than the negative slope of the gate signal applied to the gate terminals of the second and third PMOS transistors P2 and P3, the second and third PMOS transistors P2 and P3 are turned ON at a faster rate than the first PMOS transistor P1.

After the second and third PMOS transistors P2 and P3 are completely turned ON but before the first PMOS transistor is completely turned ON, a gate signal having a rising edge is applied to the gate terminals of the first, second and third NMOS transistors N1, N2 and N3. Thus, the first, second and third NMOS transistors N1, N2 and N3 are turned ON approximately at the same time.

Figure 3A:
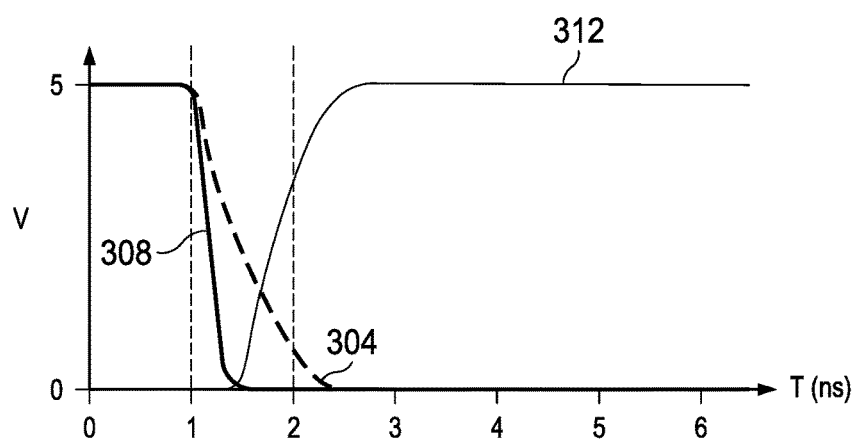
FIGS. 3A-3B and 4A-4B are timing diagrams of gate signals and voltage waveforms.

FIG. 3A is a timing diagram illustrating the gate signals applied to the gate terminals of the PMOS transistors P1, P2 and P3 and the NMOS transistors N1, N2 and N3. With reference to FIG. 3, at t=ins a gate signal 304 is applied to the gate terminal of the first PMOS transistor P1 and a gate signal 308 is applied to the terminals of both the second and third PMOS transistors P2 and P3. Although both the gate signals 304 and 308 are applied approximately at the same time, the gate signal 304 has a slower falling edge than the falling edge of the gate signal 308. As a result, the first PMOS transistor P1 is turned ON at a slower rate than the second and third PMOS transistors P2 and P3.

After the second and third PMOS transistors P2 and P3 are completely turned ON but before the first PMOS transistor P1 is completely turned ON, a gate signal 312 is applied to the gate terminals of the first, second and third NMOS transistors N1, N2 and N3. Since the same gate signal having a rising edge is applied to the first, second and third NMOS transistors, the first, second and third NMOS transistors N1, N2 and N3 are turned ON at approximately the same rate.

Thus, in the exemplary embodiments of the present disclosure, the first, second and third PMOS transistors P1, P2 and P3 are turned ON before the first, second and third NMOS transistors N1, N2 and N3. Also, the first PMOS transistor P1 is turned ON at a slower rate than the PMOS transistors P2 and P3. Since the PMOS transistors P2 and P3 conduct the higher of the two voltages present at outputs 140 and 144 first, and also because the PMOS transistor P1 conducts the higher of the two voltages present at the sampling nodes 124 and 128 first, and also because P1, P2, and P3 are turned ON before N1, N2, and N3 are turned ON, the voltage at summing nodes 116 and 120 will initially rise.

After the PMOS transistors P1, P2 and P3 are turned ON, the NMOS transistors N1, N2 and N3 are turned ON to complete the charge redistribution at the summing terminals 116 and 120 during the transfer phase. By first turning ON the PMOS transistors P1, P2 and P3 and delaying turning ON of the NMOS transistors N1, N2 and N3, the voltages at the summing terminals 116 and 120 are raised pre-emptively to compensate for a subsequent voltage dip which results from combining the charges from the capacitors. The NMOS switches N1, N2 and N3 are turned ON approximately concurrently to minimize negative transient voltage at the summing terminals 116 and 120.

Figure 3B:
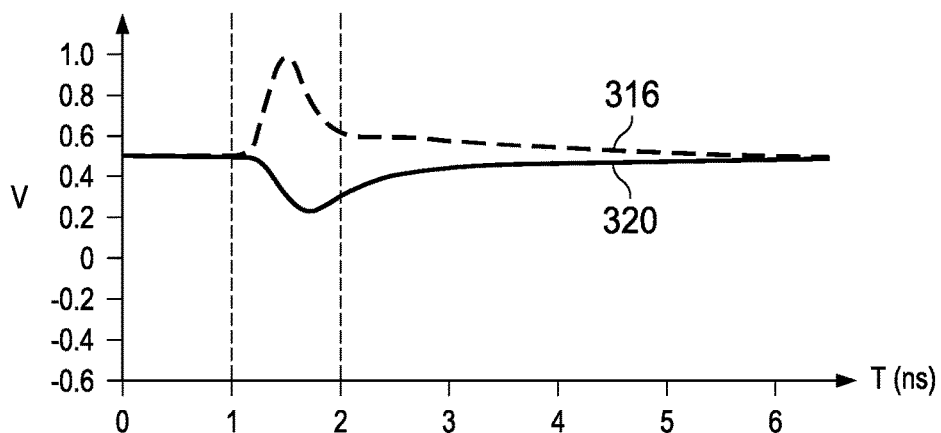

FIG. 3B is a timing diagram illustrating resulting voltage waveforms 316 and 320 at the summing terminals 116 and 120, respectively, during the transfer phase responsive to the gate signals 304, 308 and 312. By controlling the timing of the gate signals 304, 308 and 312 during the transfer phase, the voltages at the summing terminals 116 and 120 are held approximately 200 mV above ground, thereby preventing negative transient voltage at the summing terminals 116 and 120. As a result, charge losses are reduced, thereby reducing gain error, gain error drift and minimizing nonlinearity performance degradations.

Figure 4A:
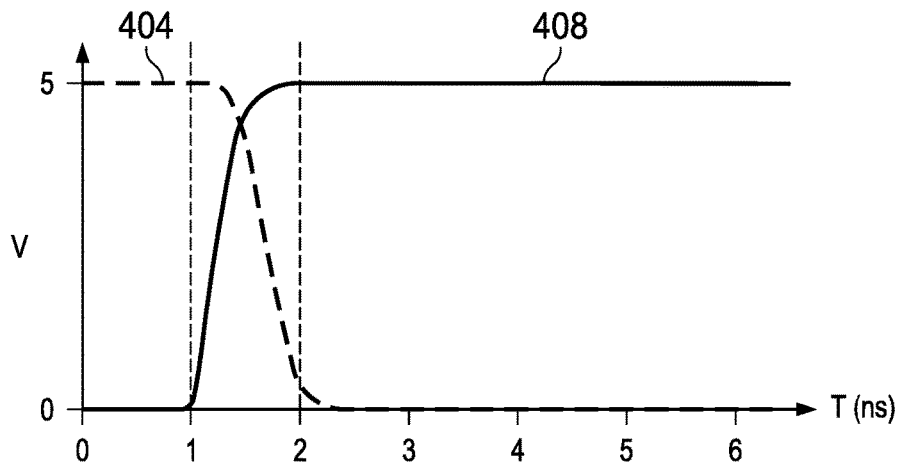
Figure 4B:
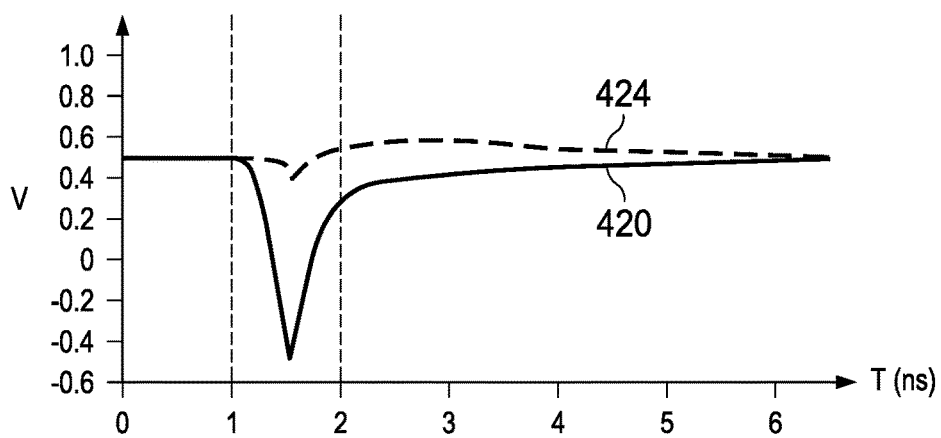

FIG. 4A is a timing diagram of gate signals 404 and 408 whose timing are not controlled in accordance with the present disclosure. When the gate signal 404 is applied to the gate terminals of the PMOS transistors P1, P2 and P3 and the gate signal 408 is applied to the gate terminals of the NMOS transistors N1, N2, and N3, negative transient voltage occurs at the summing terminals 116 and 120 during the transfer phase. FIG. 4B is a timing diagram of resulting voltage waveforms 420 and 424 at the summing terminals 116 and 120 responsive to the gate signals 404 and 408 whose timing are not controlled in accordance with the present disclosure. Since the timing of the gate signals 404 and 408 are not controlled, both the voltage waveforms 420 and 424 exhibit negative transient dip during the transfer phase. In particular the voltage at the summing terminal 116 dips below −400 mV, resulting in charge losses and performance degradation. A comparison of FIGS. 3B and 4B clearly shows by controlling the timing of the PMOS and NMOS transistors in accordance with the present disclosure, negative transient voltage at the summing terminals is prevented, thereby reducing charge losses and performance degradations.

In one aspect of the present disclosure, a method reduces charge losses at summing terminals which connect an analog to digital converter (ADC) to a digital to analog converter (DAC) by controlling the timing of PMOS and NMOS transistors of the ADC and the DAC. The method includes applying respective gate signals to gate terminals of a first PMOS transistor of the ADC and second and third PMOS transistors of the DAC. The gate signal applied to the first PMOS transistor has a slower falling edge than the gate signals applied to the second and third PMOS transistors. As a result, the first PMOS transistor of the ADC is turned ON at a slower rate than the second and third PMOS transistors of the DAC.

After the second and third PMOS transistors of the DAC are completely turned ON but before the first PMOS transistor is completely turned ON, the method includes applying a gate signal having a rising edge to gate terminals of a first NMOS transistor of the ADC and second and third NMOS transistors of the DAC. As a result, the first NMOS transistor of the ADC and the second and third NMOS transistors of the DAC are turned ON at approximately the same rate. The method also includes turning OFF the first NMOS and PMOS transistors of the ADC during the sampling phase to electrically disconnect first and second sampling terminals of the ADC. The method also includes turning ON the second NMOS and PMOS transistors of the DAC during the transfer phase to electrically connect a first DAC output and a first DAC terminal. The method also includes turning ON the third NMOS and PMOS transistors of the DAC during the transfer phase to electrically connect a second DAC output and a second DAC terminal.

Various illustrative components, blocks, modules, circuits, and steps have been described above in general terms of their functionality. Whether such functionality is implemented as hardware or software depends upon the particular application and design constraints imposed on the overall system. The described functionality may be implemented in varying ways for each particular application, but such implementation decision should not be interpreted as causing a departure from the scope of the present disclosure.

For simplicity and clarity, the full structure and operation of all systems suitable for use with the present disclosure is not being depicted or described herein. Instead, only so much of a system as is unique to the present disclosure or necessary for an understanding of the present disclosure is depicted and described.

What is claimed is:

1. A circuit comprising:
    a first capacitor coupled between a first sampling terminal and a first summing terminal;
    a second capacitor coupled between a second sampling terminal and a second summing terminal;
    first NMOS and PMOS transistors coupled in parallel, the first and second PMOS transistors configured to electrically disconnect the first and second sampling terminals during a sampling phase and to electrically connect the first and second sampling terminals during a transfer phase;
    a third capacitor coupled between the first summing terminal and a first DAC terminal;
    a fourth capacitor coupled between the second summing terminal and a second DAC terminal;
    second NMOS and PMOS transistors coupled in parallel, the second NMOS and PMOS transistors to electrically connect a first DAC output and the first DAC terminal during the transfer phase and to electrically disconnect the first DAC output and the first DAC terminal during the sampling phase;
    third NMOS and PMOS transistors coupled in parallel, the third NMOS and PMOS transistors to electrically connect a second DAC output and the second DAC terminal during the transfer phase and to electrically disconnect the second DAC output and the second DAC terminal during the sampling phase,
    wherein respective gate signals are configured to be applied to gate terminals of the first, second and third PMOS transistors, and wherein the gate signal configured to be applied to the first PMOS transistor has a slower falling edge than the gate signal configured to be applied to the second and third PMOS transistors,
    and wherein a gate signal is configured to be applied to gate terminals of the first, second and third NMOS transistors after the second and third PMOS transistors are turned ON completely but before the first PMOS transistor is turned ON completely.

2. The circuit of claim 1, wherein the first PMOS transistor is turned ON at a slower rate than the second and third PMOS transistors.

3. The circuit of claim 1, wherein the first, second and third NMOS transistors are turned ON after the first, second and third PMOS transistors are turned ON.

4. The circuit of claim 1, wherein the gate signals are removed from the gate terminals of the first PMOS and NMOS transistors during the sampling phase to electrically disconnect the first and second sampling terminals.

5. The circuit of claim 1, wherein the gate signals are removed from the gate terminals of the second PMOS and NMOS transistors during the sampling phase to electrically disconnect the first DAC output and the first DAC terminal.

6. The circuit of claim 1, wherein the gate signals a removed from the gate terminals of the third PMOS and NMOS transistors during the sampling phase to electrically disconnect the second DAC output and the second DAC terminal.

7. The circuit of claim 1, wherein the ADC comprises a fourth switch configured to electrically connect the first and second summing terminals during the sampling phase and to electrically disconnect the first and second summing terminals during the transfer phase.

8. The circuit of claim 1, wherein the DAC comprises a fifth switch configured to electrically connect the first and second DAC terminals during the sampling phase and to electrically disconnect the first and second DAC terminals during the transfer phase.

9. The circuit of claim 1, wherein the ADC comprises a differential integrator having first and second inputs which are coupled to the respective first and second summing terminals during the transfer phase to integrate residual charges at the first and second summing terminals.

10. A circuit comprising:
    a first capacitor coupled between a first sampling terminal and a first summing terminal;
    a second capacitor coupled between a second sampling terminal and a second summing terminal;
    first NMOS and PMOS transistors having respective source, drain and gate terminals, the drain terminal of the first NMOS transistor coupled to the source terminal of the first PMOS transistor and the source terminal of the first NMOS transistor coupled to the drain terminal of the first PMOS transistor, the first and second PMOS transistors operable to electrically disconnect the first and second sampling terminals during a sampling phase and to electrically connect the first and second sampling terminals during a transfer phase;
    a third capacitor coupled between the first summing terminal and a first DAC terminal;
    a fourth capacitor coupled between the second summing terminal and a second DAC terminal;
    second NMOS and PMOS transistors having respective drain, source and gate terminals, the drain terminal of the second NMOS transistor coupled to the source terminal of the second PMOS transistor and the source terminal of the second NMOS transistor coupled to the drain terminal of the second PMOS transistor, the second NMOS and PMOS transistors operable to electrically connect a first DAC output and the first DAC node during the transfer phase and to electrically disconnect the first DAC output and the first DAC terminal during the sampling phase;

third NMOS and PMOS transistors having respective drain, source and gate terminals, the drain terminal of the third NMOS transistor coupled to the source terminal of the third PMOS transistor and the source terminal of the third NMOS transistor coupled to the drain terminal of the third PMOS transistor, the third NMOS and PMOS transistors operable to electrically connect a second DAC output and the second DAC terminal during the transfer phase and to electrically disconnect the second DAC output and the second DAC terminal during the sampling phase, wherein respective gate signals are configured to be applied to gate terminals of the first, second and third PMOS transistors, and wherein the gate signal configured to be applied to the first PMOS transistor has a slower falling edge than the gate signal configured to be applied to the second and third PMOS transistors, and wherein respective gate signals are applied to gate terminals of the first, second and third NMOS transistors after the second and third PMOS transistors are turned ON completely but before the first PMOS transistor is turned ON completely.

11. The circuit of claim 10, wherein the first PMOS transistor is turned ON at a slower rate than the second and third PMOS transistors.

12. The circuit of claim 10, wherein the first, second and third NMOS transistors are turned ON after the first, second and third PMOS transistors are turned ON.

13. The circuit of claim 10, wherein the gate signals are removed from the gate terminals of the first PMOS and NMOS transistors during the sampling phase to electrically disconnect the first and second sampling terminals.

14. The circuit of claim 10, wherein the gate signals are removed from the gate terminals of the second PMOS and NMOS transistors during a sampling phase to electrically disconnect the first DAC terminal and the first DAC output.

15. The circuit of claim 10, wherein the gate signals are removed from the gate terminals of the third PMOS and NMOS transistors during the sampling phase to electrically disconnect the second DAC terminal and the second DAC output.

16. The circuit of claim 10, wherein the ADC comprises a fourth switch configured to electrically connect the first and second summing terminals during the sampling phase and to electrically disconnect the first and second summing terminals during the transfer phase.

17. The circuit of claim 10, further comprising:
an ADC gate driver configured to apply the respective gate signals to the gate terminals of the first PMOS and NMOS transistors; and
a DAC gate driver configured to apply the respective gate signals to the gate terminals of the second PMOS and NMOS transistors and to the gate terminals of the third PMOS and NMOS transistors,
wherein the gate signal applied to the first PMOS transistor has a slower falling edge than the gate signal applied to the second and third PMOS transistors.

18. A circuit comprising:
a first capacitor coupled between a first sampling terminal and a first summing terminal;
a second capacitor coupled between a second sampling terminal and a second summing terminal;
first NMOS and PMOS transistors having respective drain, source and gate terminals, the drain terminal of the first NMOS transistor coupled to the source terminal of the first PMOS transistor and the source terminal of the first NMOS transistor coupled to the drain terminal of the first PMOS transistor, the first NMOS and PMOS transistors operable to electrically disconnect the first and second sampling terminals during a sampling phase and to electrically connect the first and second sampling terminals during a transfer phase;
an ADC gate driver configured to apply respective gate signals to the gate terminals of the first PMOS and NMOS transistors;
a differential integrator having first and second inputs coupled to the respective first and second summing terminals during the transfer phase to integrate a residual charge at the first and second summing terminals;
a third capacitor coupled between the first summing terminal and a first DAC terminal;
a fourth capacitor coupled between the second summing terminal and a second DAC terminal;
second NMOS and PMOS transistors having respective drain, source and gate terminals, the drain terminal of the second NMOS transistor coupled to the source terminal of the second PMOS transistor and the source terminal of the second NMOS transistor coupled to the drain terminal of the second PMOS transistor, the second NMOS and PMOS transistors operable to electrically connect a first DAC output and the first DAC terminal during the transfer phase and to electrically disconnect the first DAC output and the first DAC terminal during the sampling phase;
third NMOS and PMOS transistors having respective drain, source and gate terminals, the drain terminal of the third NMOS transistor coupled to the source terminal of the third PMOS transistor and the source terminal of the third NMOS transistor coupled to the drain terminal of the third PMOS transistor, the third NMOS and PMOS transistors operable to electrically connect a second DAC output and the second DAC terminal during the transfer phase and to electrically disconnect the second DAC output and the second DAC terminal during the sampling phase;
a DAC gate driver configured to apply respective gate signals to gate terminals of the second and third PMOS and NMOS transistors,
wherein the gate signal applied to the first PMOS transistor has a slower falling edge than the gate signal applied to the second and third PMOS transistors,
and wherein the gate signals are applied to gate terminals of the first, second and third NMOS transistors after the second and third PMOS transistors are turned ON completely but before the first PMOS transistor is turned ON completely.

19. The circuit of claim 18, wherein the first PMOS transistor is turned ON at a slower rate than the second and third PMOS transistors.

20. The circuit of claim 18, wherein the first, second and third NMOS transistors are turned ON after the first, second and third PMOS transistors are turned ON.

21. The circuit of claim 18, wherein the ADC comprises a fourth switch configured to electrically connect the first and second summing terminals during the sampling phase and to electrically disconnect the first and second summing terminals during the transfer phase.

22. The circuit of claim 18, wherein the DAC comprises a fifth switch configured to electrically connect the first and second DAC terminals during the sampling phase and to electrically disconnect the first and second DAC terminals during the transfer phase.

23. The circuit of claim 18, wherein the gate signals are removed from the gate terminals of the first PMOS and NMOS transistors during the sampling phase to electrically disconnect the first and second sampling terminals.

24. The circuit of claim 18, wherein the gate signals are removed from the gate terminals of the second and third PMOS and NMOS transistors during the sampling phase.

25. A circuit comprising:
first and second summing terminals;
a first capacitor coupled between a first sampling terminal and the first summing terminal;
a second capacitor coupled between a second sampling terminal and the second summing terminal;
first NMOS and PMOS transistors coupled in parallel between the first and second sampling terminals and configured to electrically disconnect the first and second sampling terminals during a sampling phase and to electrically connect the first and second sampling terminals during a transfer phase;
a third capacitor coupled between the first summing terminal and a first DAC terminal;
a fourth capacitor coupled between the second summing terminal and a second DAC terminal;
second NMOS and PMOS transistors coupled in parallel and configured to electrically connect a first DAC output and the first DAC terminal during the transfer phase and to electrically disconnect the first DAC output and the first DAC terminal during the sampling phase;
third NMOS and PMOS transistors coupled in parallel and configured to electrically connect a second DAC output and the second DAC terminal during the transfer phase and to electrically disconnect the second DAC output and the second DAC terminal during the sampling phase,
wherein respective gate signals are applied to gate terminals of the first, second and third PMOS transistors, and wherein the gate signal applied to the first PMOS transistor has a slower falling edge than the gate signal applied to the second and third PMOS transistors to turn ON the first PMOS transistor at a slower rate than the second and third PMOS transistors,
and wherein gate signals are applied to gate terminals of the first, second and third NMOS transistors after the second and third PMOS transistors are turned ON completely but before the first PMOS transistor is turned ON completely to prevent negative transient voltage at the first and second summing terminals during the transfer phase.

26. The circuit of claim 25, wherein the first, second and third NMOS transistors are turned ON after the first, second and third PMOS transistors are turned ON.

27. The circuit of claim 25, wherein the gate signals are removed from the gate terminals of the first PMOS and NMOS transistors during the sampling phase to electrically disconnect the first and second sampling terminals.

28. The circuit of claim 25, further comprising:
an ADC gate driver configured to apply the respective gate signals to the gate terminals of the first PMOS and NMOS transistors; and
a DAC gate driver configured to apply the respective gate signals to the gate terminals of the second PMOS and NMOS transistors and to the gate terminals of the third PMOS and NMOS transistors, wherein the gate signal applied to the first PMOS transistor has a slower falling edge than the gate signal applied to the second and third PMOS transistors.

29. The circuit of claim 25, further comprising a differential integrator having first and second inputs coupled to the respective first and second summing terminals during the transfer phase to integrate residual charges at the first and second summing terminals.

30. A method for reducing charge losses at summing terminals which connect an analog to digital converter (ADC) to a digital to analog converter (DAC) by controlling operation of PMOS and NMOS transistors of the ADC and the DAC, the method comprising:
applying respective gate signals to gate terminals of a first PMOS transistor of the ADC and second and third PMOS transistors of the DAC, wherein the gate signal applied to the first PMOS transistor has a slower falling edge than the gate signal applied to the second and third PMOS transistors, and wherein the first PMOS transistor of the ADC is turned ON at a slower rate than the second and third PMOS transistors of the DAC; and
after the second and third PMOS transistors are turned ON completely but before the first PMOS transistor is turned ON completely, applying respective gate signals to gate terminals of a first NMOS transistor of the ADC and second and third NMOS transistors of the DAC, wherein the gate signals applied to the first NMOS transistor of the ADC and the second and third NMOS transistors of the DAC have a same rising edge.

31. The method of claim 30, further comprising turning ON the first NMOS transistor of the ADC and the second and third NMOS transistors of the DAC at a same rate.

32. The method of claim 30, further comprising turning ON the first NMOS transistor of the ADC and the second and third NMOS transistors of the DAC after the first PMOS transistor of the ADC and the second and third PMOS transistors of the DAC are turned ON.

33. The method of claim 30, further comprising turning ON the first NMOS and PMOS transistors of the ADC during a transfer phase to electrically connect first and second sampling terminals of the ADC.

34. The method of claim 30, further comprising turning OFF the first NMOS and PMOS transistors of the ADC during a sampling phase to electrically disconnect first and second sampling terminals of the ADC.

35. The method of claim 30, further comprising turning ON the second NMOS and PMOS transistors of the DAC during a transfer phase to electrically connect a first DAC output and a first DAC terminal.

36. The method of claim 30, further comprising turning ON the third NMOS and PMOS transistors of the DAC during a transfer phase to electrically connect a second DAC output and a second DAC terminal.

37. The method of claim 30, further comprising turning OFF the second NMOS and PMOS transistors of the DAC during a sampling phase to electrically disconnect a first DAC output and a first DAC terminal.

38. The method of claim 30, further comprising turning OFF the third NMOS and PMOS transistors of the DAC during a sampling phase to electrically disconnect a second DAC output and a second DAC terminal.

* * * * *